(12) United States Patent
Gordon

(10) Patent No.: US 6,700,075 B2
(45) Date of Patent: Mar. 2, 2004

(54) REDUCED CROSSTALK ULTRASONIC PIEZO FILM ARRAY ON A PRINTED CIRCUIT BOARD

(75) Inventor: James H. Gordon, Fairfax, VA (US)

(73) Assignee: Cavitat Medical Technologies, Ltd., Aurora, CO (US)

( * ) Notice: Subject to any disclaimer, the term of this patent is extended or adjusted under 35 U.S.C. 154(b) by 137 days.

(21) Appl. No.: 09/757,095

(22) Filed: Jan. 10, 2001

(65) Prior Publication Data

US 2002/0089834 A1 Jul. 11, 2002

(51) Int. Cl.[7] .............................. H05K 7/06; H05K 9/00
(52) U.S. Cl. ........................ 174/261; 174/254; 174/255; 361/780; 361/781; 439/77; 439/941
(58) Field of Search ................................ 361/749–751, 361/777, 778, 780, 781, 794; 439/67, 77, 941, 493; 174/254, 255, 261

(56) References Cited

U.S. PATENT DOCUMENTS

| 4,954,929 | A | * | 9/1990 | Baran ......................... 361/794 |
|---|---|---|---|---|
| 5,166,573 | A | | 11/1992 | Brown ......................... 310/334 |
| 5,790,383 | A | * | 8/1998 | Inagawa ....................... 361/760 |
| RE35,884 | E | * | 9/1998 | Ellis ........................... 250/207 |
| 6,030,221 | A | | 2/2000 | Jones ........................ 433/215 |
| 6,040,985 | A | * | 3/2000 | Arai et al. ..................... 361/780 |
| 6,319,020 | B1 | * | 11/2001 | Brimhall et al. ............. 439/700 |
| 6,365,839 | B1 | * | 4/2002 | Robbins et al. .............. 174/255 |
| 6,528,732 | B1 | * | 3/2003 | Okubora et al. ............. 174/255 |

* cited by examiner

Primary Examiner—David L. Talbott
Assistant Examiner—John B. Vigushin
(74) Attorney, Agent, or Firm—Antonelli, Terry, Stout & Kraus, LLP

(57) ABSTRACT

A reduced noise ultrasound piezo film array on a printed circuit board. A printed circuit board carries a piezo array on one end and a standard coupling at the other end. The board is made in four layers with the two external layers being ground planes to prevent noise pickup. The two internal layers carry printed circuit lines between various elements of the array and terminals of the connector. The various arrays are sequentially scanned. All of the lines except the one selected are connected to ground to prevent crosstalk and noise pickup.

10 Claims, 3 Drawing Sheets

REDUCED CROSSTALK ULTRASONIC PIEZO FILM ARRAY ON A PRINTED CIRCUIT BOARD

BACKGROUND OF THE INVENTION

Field of the Invention

This invention relates to an ultrasonic piezo film array on a printed circuit board. More particularly, the present invention relates to an ultrasonic piezo film array on a printed circuit board which has reduced crosstalk and noise pickup by having top and bottom ground planes on opposite sides of the printed circuit and by grounding all connections to the pads except the one from which the input is received.

SUMMARY OF THE INVENTION

Ultrasound has been used for a variety of applications in the medical field. This technique is preferable to radiation since there are no bad effects from the use of the ultrasound and the equipment is less costly, smaller in size and easier to use than x-ray equipment. Thus, it has been used in soft tissue imaging, in measuring bone density and in locating cavities in the jawbone and other similar locations. In particular, U.S. Pat. No. 6,030,221 shows an apparatus for detecting bone cavitation utilizing an ultrasonic transmitter and multiplexer with an ultrasonic receiver array.

While such a system is very effective, it is important that the array be as small as possible for easy location and also that the connecting lines be as small as possible. The use of coaxial cable, even if of a small gauge, can present problems, especially when it is necessary for the array to be inside the patients' mouth. Further, it is important to have as large an array of receiving elements as possible in order to obtain the best image. In addition to this, it is important that crosstalk and noise be eliminated as much as possible so that the relatively small signal is as clear as possible.

Accordingly, these objects have been achieved in the present invention by providing a flexible printed circuit board having four layers, with the outer two layers being ground planes and the inner layers carrying printed circuit lines. An array of pads is provided on the end of the board for receiving piezo elements. The lines are connected to a multiplexer which sequentially accesses each line leading to the elements of the array. All other lines are connected to ground at the same time.

Accordingly, a system is provided which avoids crosstalk and noise and yet provides a small flexible board for carrying an array of receiver elements.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
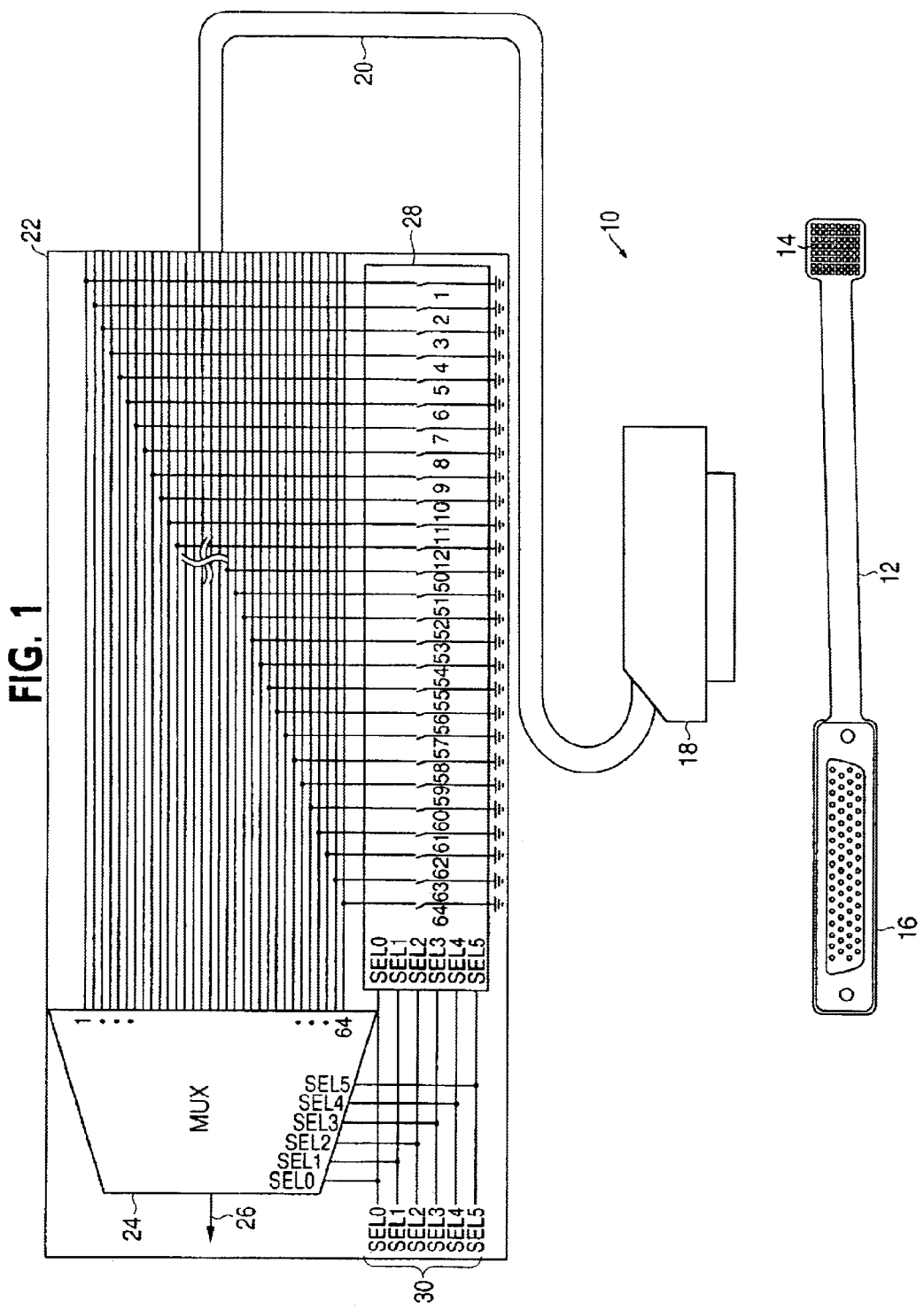
FIG. 1 is a schematic diagram of the system of the present invention.

Referring now to the drawings, wherein like reference numerals designate identical or corresponding parts throughout the several views, and more particularly to FIG. 1 thereof, wherein system 10 is shown as Including a printed circuit board arrangement 12. The circuit board includes an array 14 of ultrasonic plezo film elements. For purposes of discussion, this array will be indicated as an 8×8 array, although any number of elements is possible. Usually, it is preferable to have as large a number as possible in order to obtain better resolution of the image. However, this is limited by the amount of space available since it is also preferable to keep the printed circuit board small for easy positioning.

At the other end of the printed circuit board, contacts are formed which are connected to a connector 16 which is mateable with a standard pin connector 18 so that the printed circuit board can be connected to receiver electronics. The pins of connector 16 are connected to the corresponding elements of array 14 by way of lines printed on the internal layers of the printed circuit board 12. Connector 18 is connected by way of cable 20 to a receiver device 22. The cable contains the same number of wires as there are pins on connectors 16 and 18. The various wires are encased in a common outer braided shield to prevent noise. Of course, other types of cabling could be utilized.

The input lines from the cable are connected to multiplexer 24 which sequentially selects one of the input lines for connection to output line 26 which is attached to further electronic processing devices such as an amplifier. Switching device 28 is also connected to the input lines, but operates in the reverse fashion of multiplexer 24. That is, all of the input lines except the selected one are connected to ground while the switch to the selected line is left open. Address input 30 is connected to both multiplexer 24 and switch unit 28 so that the selected input line is indicated to both at the same time. The result of this is that the selected line is connected to the amplifier in a standard fashion while the remaining lines are all connected to ground. This causes all of the input lines to be grounded so that no extraneous crosstalk signals can be generated and also other noise is prevented.

Figure 2:
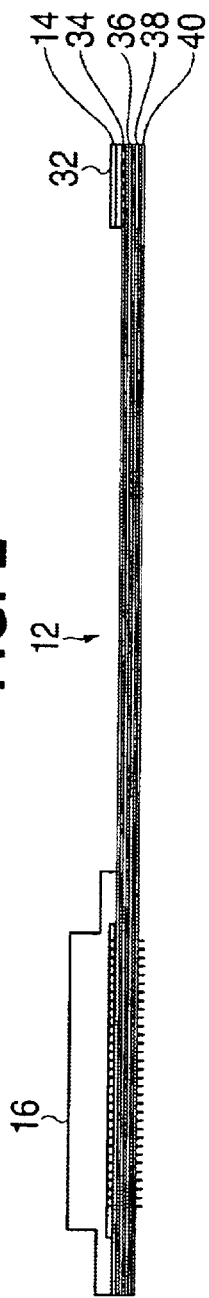
FIG. 2 is a cross sectional view of the printed circuit board of the present invention.

FIG. 2 shows a cross sectional view of the printed circuit board 12. The board carries the connector 16 at one end and array 14 at the other end as previously discussed. The array is covered by a gold vapor deposition layer 32 which is grounded. The printed circuit board is made of four layers, 34, 36, 38 and 40. The top and bottom layers, 34 and 40 are ground planes which also act to shield the internal two boards to help prevent noise. The top layer 34 also has copper pads aligned with the various elements of array 14 so as to interconnect the array with the printed circuit board.

Figure 3:
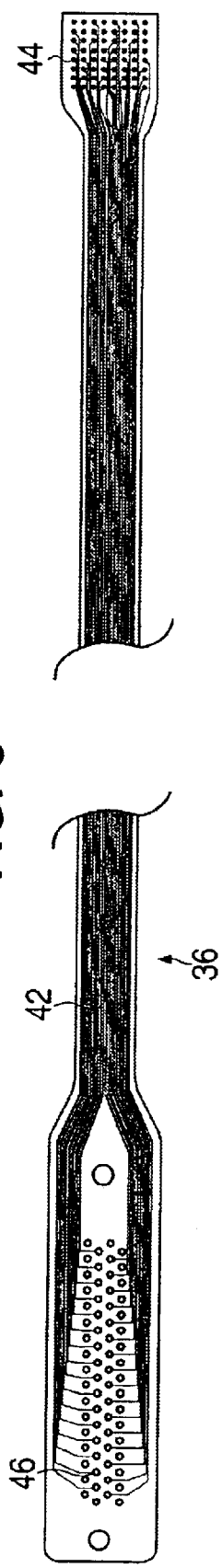
FIG. 3 is a top view of one layer of the printed circuit board of the present invention.

The two internal layers 36 and 38 each contain a printed line arrangement for connecting the various pads connected to the elements of the array to the contacts associated with connector 16. While two such layers are shown, if the number of elements in the array is small enough or if the printed lines can be made small enough, this can be accommodated in a single layer. Likewise, if the number of elements in the array is larger, additional internal layers may also be utilized. As shown in FIG. 3, layer 36 includes a series of printed lines 42, each of which is connected to one of the contacts 44 associated with one element of the array. These lines are only connected to half of the contacts since the other half are connected on layer 38. The other end of each line 42 is connected to one of the contacts 46 which is then electrically connected to one of the terminals in connector 16.

The circuit board 12 can be of any size desired within the limits of producing the array and printed circuit lines.

However, for medical imaging, in order to limit the size of the array and in order to allow the printed circuit board to be flexible, one example would involve an 8×8 array. The pad associated with each array could be approximately 50 mils square. The spacing between pads would be as small as allowed by fabrication techniques, such as a 5 mil spacing. Ordinarily, the overall array size would be 435 mils square. Each pad could have a 6 mil hole drilled therethrough for electrical connection to other layers of the printed circuit board. Conventional printed circuit board manufacturing techniques will allow for 4 mil lines on layers 36 and 38 with 4 mil spacing between lines. The size of the overall board can vary according to the number of lines necessary and the size of the array. However, for the example given above, the overall length of the board can be roughly 15 inches with the array end being just over a half inch wide and the connector end being roughly 0.6 inch wide. The connector end can be roughly 3 inches in length and the array end can be roughly ¾ inch. The central 11 or so inches can have a reduced width of perhaps 0.3 inch. The printed circuit board can be a flexible board or may be rigid if desired. Connectors 16 and 18 can be standard 68 pin SCSI connectors. 64 of the pins would correspond to the 64 elements of the array. The other four may be grounded to opposite sides of each of the internal layers.

Figure 4:
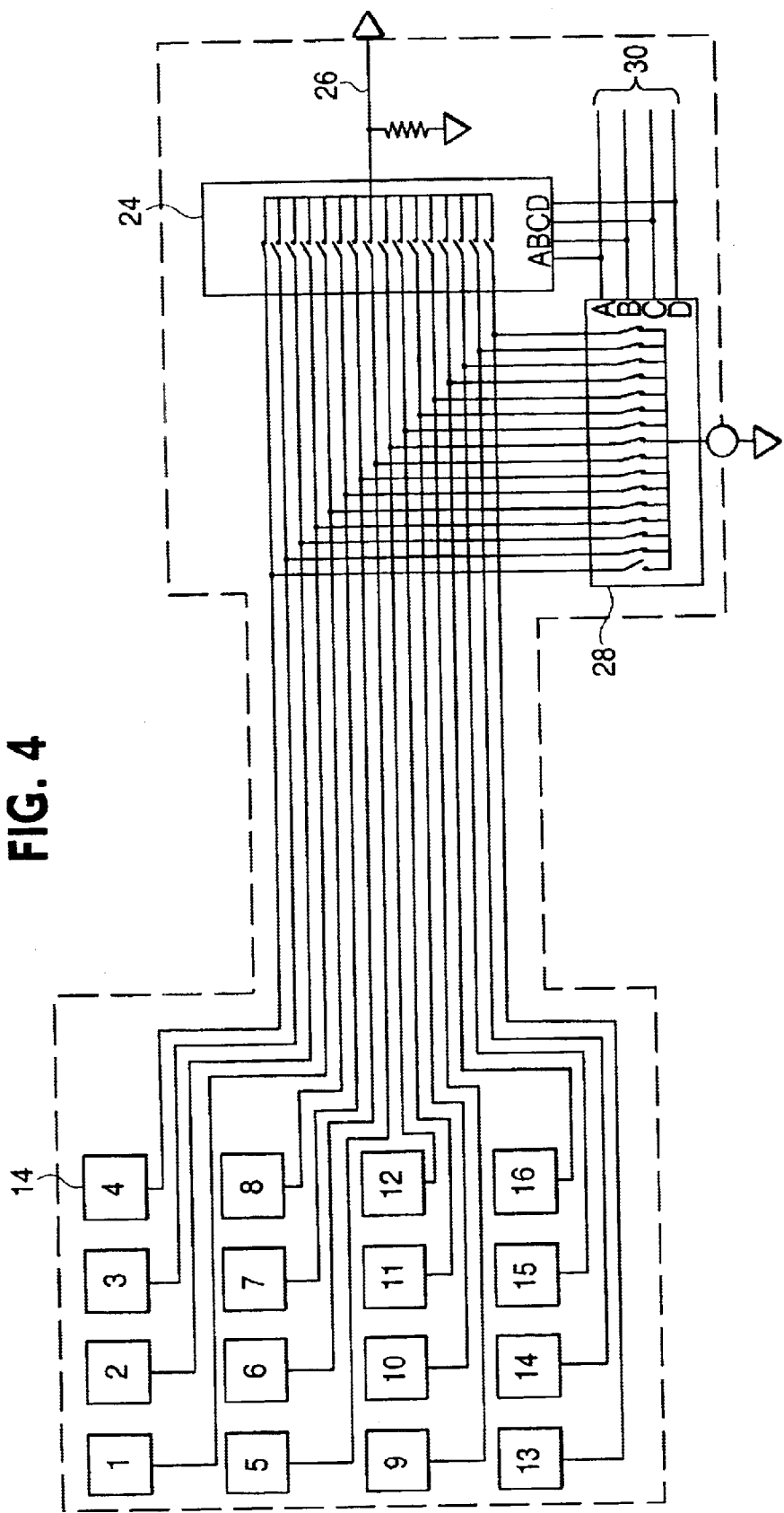
FIG. 4 is a schematic diagram of the electrical connections of the present invention.

FIG. 4 shows a simplified arrangement of 16 elements of an array with their connections to the multiplexer and switching units. As can be seen in this diagram, the top line which is connected at one end to array element 4 is connected at the other end in multiplexer 24 to the output line connected to an amplifier. At the same time, this same line is connected in the switching device to the only switch which is open at that time. The remaining switches are all connected to ground so that every line connected to each pad except the selected one is grounded to prevent noise and crosstalk. Both the multiplexer and the switching element are connected to the same address line 30 so that the same line is selected in both cases. The addressing circuitry can be the same in both units. As can be appreciated, the switching unit operates in exactly the same way as the multiplexer except that it opens one switch at a time rather than closing one switch at a time.

When the circuit board has been manufactured with the desired array pattern and electrical connections, a polyvinylidene fluoride (PVDF) piezo film with a metalization on only one side is laminated to the copper pads on the top layer of the printed circuit board with the metallized layer facing out. The outer layer is a continuous metallized layer and is connected to a ground electrode and becomes the common electrical connection for one side of each of the array elements. The thickness of the film determines the frequency range of operation. The outer layer being at ground becomes an effective shield for unwanted noise pickup.

The circuit board is preferably a flexible array to allow for easy positioning in difficult and small locations. As an example, the circuit board may flex to a 2 inch radius in both directions up to +/−90° along its length. Other types of circuit boards could also be used, even a rigid board for uses where it is not difficult to place the array.

Numerous additional modifications and variations of the present invention are possible in light of the above teachings. It is, therefore, to be understood that within the scope of the appended claims, the invention may be practiced otherwise than as specifically described herein.

What is claimed is:

1. A printed circuit board for an ultrasonic array comprising:
   an array of contact elements located at one end of said printed circuit board for contact with corresponding elements of said ultrasonic array;
   a connector at an end of said printed circuit board opposite said array of contact elements;
   a top layer and a bottom layer, each being a ground plane; and
   a plurality of internal layers between said top layer and said bottom layer and carrying thereon printed circuit lines connecting said array of contact elements with said connector.

2. The printed circuit board of claim 1, having two internal layers, with half of said contact elements being connected to lines on each layer.

3. The printed circuit board according to claim 1, wherein said printed circuit board is flexible.

4. The printed circuit board according to claim 1, wherein said printed circuit board is rigid.

5. The printed circuit board according to claim 1, wherein said contact elements are contact pads.

6. An ultrasonic receiver apparatus, comprising:
   a printed circuit board;
   an array of ultrasonic elements mounted at one end of said printed circuit board;
   printed circuit lines carried by said printed circuit board, with each line being connected to one of said ultrasonic array elements;
   a multiplexer connected to said printed circuit lines for connecting one line at a time to a receiving device; and
   a switch unit for connecting each of said printed circuit lines to ground except for said line connected by said multiplexer to said receiving unit.

7. The system according to claim 6, wherein said circuit board further includes a top ground plane and a bottom ground plane on opposite sides of said printed circuit lines.

8. The system according to claim 6, wherein said printed circuit board carries a connector at an end opposite said array for connection to said printed circuit lines, and wherein said multiplexer is connected through a cable to a second connector mateable with said first connector.

9. The system according to claim 6, wherein said multiplexer and said switch unit are connected to an address input for receiving the same address.

10. A method for reducing noise in a printed circuit board carrying an ultrasonic receiver array, comprising:
   printing circuit lines on a printed circuit board for connection with elements of said ultrasonic array;
   placing said printed circuit lines between an upper ground plane and a lower ground plane;
   connecting said printed circuit lines to a multiplexer for selecting one of said lines at a time for connection to a receiving unit; and
   connecting all of said printed circuit lines except said selected line to ground in order to eliminate noise.

* * * * *